(12) United States Patent
Kuwazawa et al.

(10) Patent No.: US 10,714,375 B2
(45) Date of Patent: Jul. 14, 2020

(54) SEMICONDUCTOR DEVICE AND MANUFACTURING METHOD THEREOF

(71) Applicant: SEIKO EPSON CORPORATION, Tokyo (JP)

(72) Inventors: Kazunobu Kuwazawa, Sakata (JP); Shigeyuki Sakuma, Sakata (JP); Hiroaki Nitta, Sakata (JP); Mitsuo Sekisawa, Sakata (JP); Takehiro Endo, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/365,790

(22) Filed: Nov. 30, 2016

(65) Prior Publication Data
US 2017/0170053 A1    Jun. 15, 2017

(30) Foreign Application Priority Data
Dec. 11, 2015    (JP) .................................. 2015-242058

(51) Int. Cl.
*H01L 27/082*        (2006.01)
*H01L 21/761*        (2006.01)
(Continued)

(52) U.S. Cl.
CPC ........ *H01L 21/761* (2013.01); *H01L 21/2253* (2013.01); *H01L 21/8224* (2013.01);
(Continued)

(58) Field of Classification Search
CPC ..................... H01L 27/0821; H01L 29/0692
See application file for complete search history.

(56) References Cited

U.S. PATENT DOCUMENTS 5,565,701 A * 10/1996 Zambrano ........... H01L 27/0821
257/500
2008/0237704 A1* 10/2008 Williams .............. H01L 21/761
257/338
(Continued)

FOREIGN PATENT DOCUMENTS

JP      2000-340674 A    12/2000
JP      2013-183039 A     9/2013
(Continued)

*Primary Examiner* — Moazzam Hossain
*Assistant Examiner* — Hajar Kolahdouzan
(74) *Attorney, Agent, or Firm* — Oliff PLC

(57) ABSTRACT

A semiconductor device is provided in which a zener diode having a desired breakdown voltage and a capacitor in which voltage dependence of capacitance is reduced are mounted together, and various circuits are realized. The semiconductor device includes: a semiconductor layer; a first conductivity type well that is arranged in a first region of the semiconductor layer; a first conductivity type first impurity diffusion region that is arranged in the well; a first conductivity type second impurity diffusion region that is arranged in a second region of the semiconductor layer; an insulating film that is arranged on the second impurity diffusion region; an electrode that is arranged on the insulating film; and a second conductivity type third impurity diffusion region that is arranged at least on the first impurity diffusion region.

12 Claims, 13 Drawing Sheets

(51) Int. Cl.

| | | |
|---|---|---|
| *H01L 29/735* | (2006.01) | |
| *H01L 29/66* | (2006.01) | |
| *H01L 29/78* | (2006.01) | |
| *H01L 21/8224* | (2006.01) | |
| *H01L 21/8228* | (2006.01) | |
| *H01L 27/092* | (2006.01) | |
| *H01L 29/732* | (2006.01) | |
| *H01L 21/225* | (2006.01) | |
| *H01L 27/06* | (2006.01) | |
| *H01L 27/08* | (2006.01) | |
| *H01L 29/06* | (2006.01) | |
| *H01L 29/866* | (2006.01) | |
| *H01L 29/94* | (2006.01) | |
| *H01L 29/10* | (2006.01) | |
| *H01L 29/08* | (2006.01) | |
| *H01L 29/423* | (2006.01) | |

(52) U.S. Cl.
CPC ...... *H01L 21/8228* (2013.01); *H01L 27/0676* (2013.01); *H01L 27/0814* (2013.01); *H01L 27/0821* (2013.01); *H01L 27/0922* (2013.01); *H01L 29/0684* (2013.01); *H01L 29/0692* (2013.01); *H01L 29/6625* (2013.01); *H01L 29/66106* (2013.01); *H01L 29/66181* (2013.01); *H01L 29/66272* (2013.01); *H01L 29/66681* (2013.01); *H01L 29/732* (2013.01); *H01L 29/735* (2013.01); *H01L 29/7816* (2013.01); *H01L 29/866* (2013.01); *H01L 29/94* (2013.01); *H01L 29/0626* (2013.01); *H01L 29/0878* (2013.01); *H01L 29/1083* (2013.01); *H01L 29/42368* (2013.01)

(56) References Cited

U.S. PATENT DOCUMENTS

| | | |
|---|---|---|
| 2010/0244194 A1 | 9/2010 | Masada et al. |
| 2015/0287719 A1 | 10/2015 | Furuhata |
| 2016/0035905 A1* | 2/2016 | Yoo .................. H01L 29/866 |
| | | 257/356 |

FOREIGN PATENT DOCUMENTS

| | | |
|---|---|---|
| JP | 2014-112704 A | 6/2014 |
| JP | 2015-201500 A | 11/2015 |

* cited by examiner

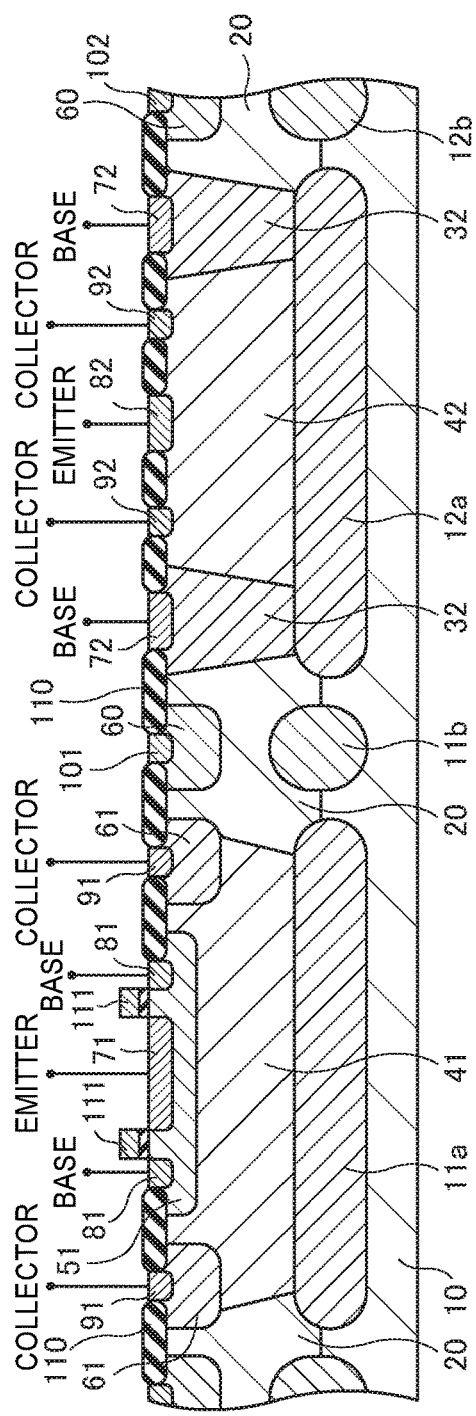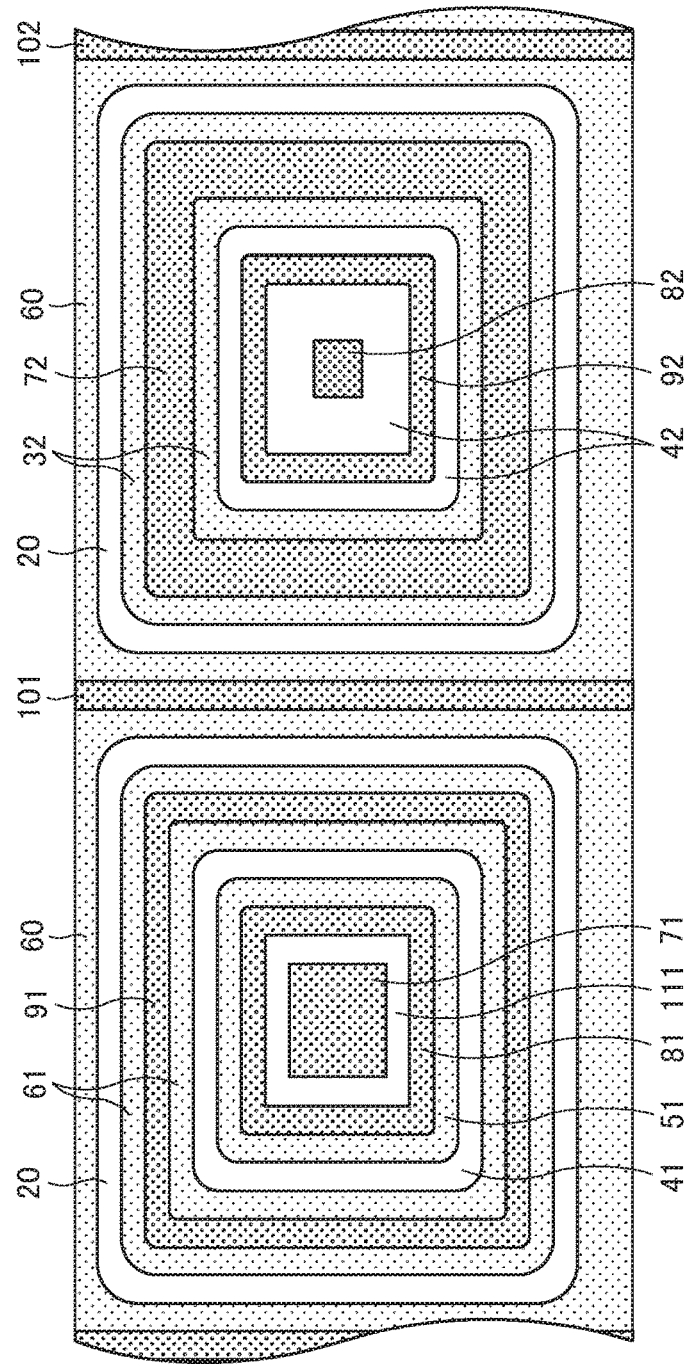
FIG. 1A
FIG. 1B

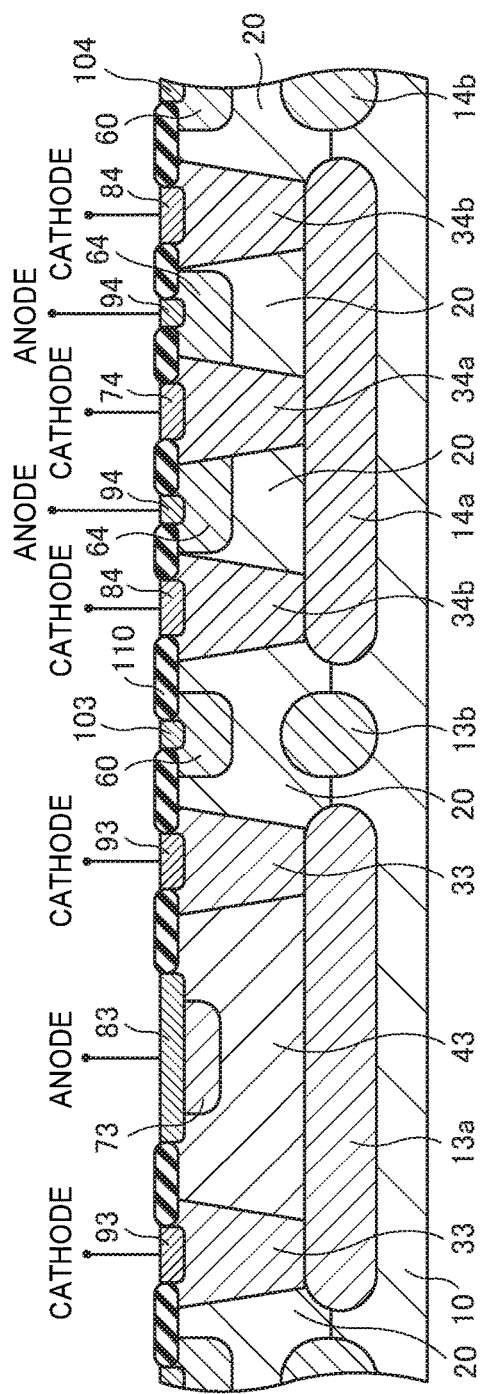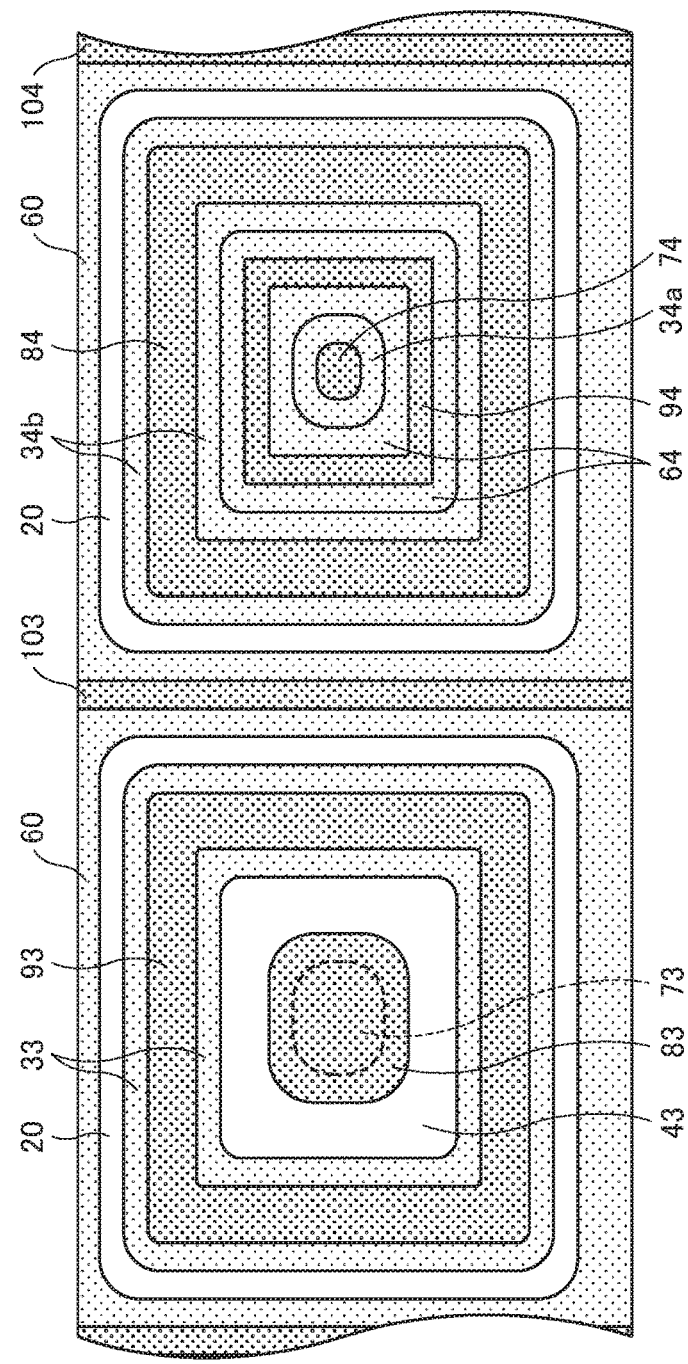
FIG. 2A
FIG. 2B

SEMICONDUCTOR DEVICE AND MANUFACTURING METHOD THEREOF

BACKGROUND

1. Technical Field

The present invention relates to a semiconductor device, a manufacturing method of the semiconductor device, and the like.

2. Related Art

A semiconductor device that includes a capacitor (MOS capacitor) that is formed by using a MOS structure as a circuit element is used, for example. A known MOS capacitor is constituted by a gate electrode formed above a semiconductor substrate via a gate insulating film and a substrate region (hereinafter, also referred to as "electrode region") that opposes the gate electrode with the gate insulating film being interposed therebetween.

However, in the case where the MOS capacitor is configured by using a substrate region having a low impurity concentration similar to a substrate region in which a MOS field effect transistor is formed, a depletion layer is generated in the electrode region due to inversion of the voltage applied to the gate electrode, and an inversion capacitance is formed. Accordingly, the total capacitance of the MOS capacitor is expressed as a series connection of the capacitance determined by the shape of the gate insulating film and the gate electrode and the inversion capacitance, and has voltage dependence.

In circuit design, in general, a capacitance having voltage dependence is difficult to use, and a capacitance having no voltage dependence is desired. Therefore, the voltage dependence of the capacitance of the MOS capacitor is avoided or reduced by increasing the impurity concentration in the electrode region such that the depletion layer is not generated in the electrode region when voltage is applied to the gate electrode.

However, if the impurity concentration in the electrode region is too high, degradation in quality occurs such as a reduction in capacitance of the MOS capacitor and a reduction in breakdown voltage of the gate insulating film caused by abnormal growth of an oxide film when the gate insulating film is formed by oxidizing a surface of the semiconductor substrate. Accordingly, an optimum value exists in the impurity concentration in the electrode region of the MOS capacitor.

Also, there are cases in which a zener diode is formed as a circuit element in a semiconductor device. The zener diode is constituted by a PN junction of a high concentration P-type impurity diffusion region and an N-type impurity diffusion region. In general, the PN junction is formed by joining a P-type impurity diffusion region that constitutes a source or a drain of a MOS field effect transistor and an N-type impurity diffusion region. Note that adjustment of the concentration in impurity diffusion regions that form the PN junction is needed when the specifications of the breakdown voltage are different.

A MOS capacitor in which voltage dependence is reduced is disclosed in JP-A-2000-340674 (paragraphs 0005-0007, FIG. 8) as a related technology. The MOS capacitor is formed in a CMOS device in which both a P-channel MOS transistor and an N-channel MOS transistor are included, and a high concentration region having the same conductivity as a semiconductor region that is located under an insulating film constituting the MOS capacitor is formed in the semiconductor region so as to be adjacent to the insulating film.

Incidentally, it is required that, in order to realize various circuits, a zener diode having a desired breakdown voltage and a capacitor in which voltage dependence of capacitance is reduced are mounted together in the semiconductor device. Meanwhile, when an attempt is made to mount a plurality of different types of circuit elements together in the semiconductor device, processes for forming dedicated impurity diffusion regions for respective circuit elements increase, and the manufacturing cost of the semiconductor device increases due to the increased number of masks and processes.

SUMMARY

A first aspect of the invention relates to providing a semiconductor device in which a zener diode having a desired breakdown voltage and a capacitor in which voltage dependence of capacitance is reduced are mounted together in order to realize various circuits. Also, a second aspect of the invention relates to providing a method of manufacturing a semiconductor device in which a zener diode having a desired breakdown voltage and a capacitor in which voltage dependence of capacitance is reduced are mounted together without significantly increasing the manufacturing processes.

A semiconductor device according to a first aspect of the invention includes: a semiconductor layer; a first conductivity type first well that is arranged in a first region of the semiconductor layer; a first conductivity type first impurity diffusion region that is arranged in the first well; a first conductivity type second impurity diffusion region that is arranged in a second region of the semiconductor layer; an insulating film that is arranged on the second impurity diffusion region; an electrode that is arranged on the insulating film; and a second conductivity type third impurity diffusion region that is arranged at least on the first impurity diffusion region. Note that, in this application, the semiconductor layer may be a semiconductor substrate, or may be an epitaxial layer arranged on a semiconductor substrate, or the like. Also, the first conductivity type may be P type and the second conductivity type may be N type, or the first conductivity type may be N type and the second conductivity type may be P type.

According to the first aspect of the invention, a vertical zener diode is configured in which the first impurity diffusion region is a portion of a cathode region or an anode region and the third impurity diffusion region is an anode region or a cathode region. Also, a capacitor is configured in which the second impurity diffusion region is a first electrode, and an electrode arranged on the insulating film is a second electrode.

In this way, according to the first aspect of the invention, the vertical zener diode including the first impurity diffusion region that mainly determines the breakdown voltage and the capacitor including the second impurity diffusion region that reduces voltage dependence of capacitance are mounted together in the same semiconductor device, and thus various circuits can be realized.

The semiconductor device may further include at least one other well that is arranged so as to surround the second impurity diffusion region in the semiconductor layer. For example, as a result of providing a second conductivity type second well that surrounds the second impurity diffusion region and a first conductivity type third well that surrounds the second well in the semiconductor layer, the insulation properties of the first electrode of the capacitor can be improved.

Also, the semiconductor device may further include a second conductivity type semiconductor substrate in which the semiconductor layer is arranged; a first conductivity type buried diffusion layer that is arranged in the semiconductor substrate; and a first conductivity type fourth impurity diffusion region that is arranged in the semiconductor layer and surrounds the first region of the semiconductor layer on the buried diffusion layer in plan view. The buried diffusion layer and the fourth impurity diffusion region constitute a portion of a cathode region or an anode region of the vertical zener diode, and can improve the element isolation properties.

A manufacturing method of a semiconductor device according to a second aspect of the invention includes: forming a first conductivity type well in a first region of a semiconductor layer; forming a first conductivity type first impurity diffusion region in the well, and simultaneously, forming a first conductivity type second impurity diffusion region in a second region of the semiconductor layer; forming an insulating film in the second impurity diffusion region; and forming an electrode on the insulating film; and forming a second conductivity type third impurity diffusion region at least on the first impurity diffusion region.

According to the second aspect of the invention, a vertical zener diode is configured in which the first impurity diffusion region is a portion of a cathode region or an anode region and the third impurity diffusion region is an anode region or a cathode region. Also, a capacitor is configured in which the second impurity diffusion region is a first electrode, and an electrode arranged on the insulating film is a second electrode.

In this way, according to the second aspect of the invention, the first impurity diffusion region that mainly determines the breakdown voltage of the vertical zener diode and the second impurity diffusion region that reduces the voltage dependence of capacitance of the capacitor can be formed in the same processes and with the same conditions. Accordingly, a semiconductor device in which a zener diode having a desired breakdown voltage and a capacitor in which voltage dependence of capacitance is reduced are mounted together without significantly increasing the manufacturing processes.

BRIEF DESCRIPTION OF THE DRAWINGS

The invention will be described with reference to the accompanying drawings, wherein like numbers reference like elements.

FIGS. 1A and 1B are diagrams illustrating a first example of a circuit element to be mounted in a semiconductor device.

FIGS. 2A and 2B are diagrams illustrating a second example of the circuit element to be mounted in the semiconductor device.

DESCRIPTION OF EXEMPLARY EMBODIMENTS

Figures 3A, 3B:
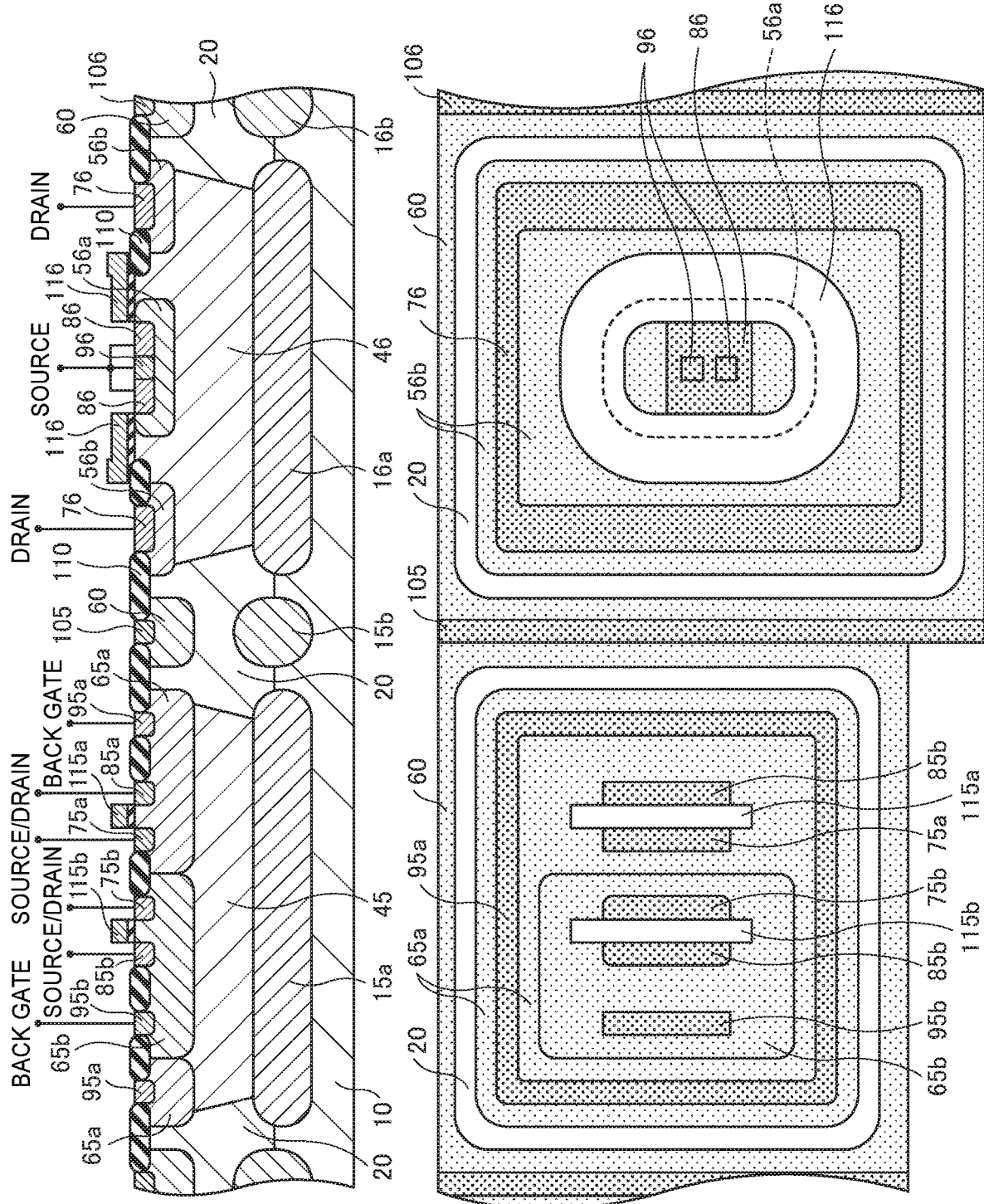
FIGS. 3A and 3B are diagrams illustrating a third example of the circuit element to be mounted in the semiconductor device.

Hereinafter, an embodiment of the invention will be described in detail, with reference to the drawings. Note that the same constituent elements are given the same reference numerals, and a redundant description is omitted.

Semiconductor Device

A semiconductor device according to one embodiment of the invention includes a plurality of different types of circuit elements. Hereinafter, examples of these circuit elements will be described with reference to FIGS. 1A to 4B. Note that the plurality of different types of circuit elements shown in FIGS. 1A to 4B are arranged on the same base substrate 10.

FIGS. 1A and 1B are diagrams illustrating a first example of the circuit element mounted in the semiconductor device according to one embodiment of the invention. The left side of FIGS. 1A and 1B shows a vertical NPN bipolar transistor, and the right side of FIGS. 1A and 1B shows a lateral PNP bipolar transistor. Also, FIG. 1A is a cross-sectional view and FIG. 1B is a plan view. Note that a field oxide film is omitted in FIG. 1B.

As shown in FIGS. 1A and 1B, the semiconductor device includes a P-type base substrate (semiconductor substrate) 10 and a P-type epitaxial layer (semiconductor layer) 20 that is arranged by epitaxially growing a P-type semiconductor on the base substrate 10. The material of the base substrate 10 and the epitaxial layer 20 is silicon (Si), for example. The epitaxial layer (semiconductor layer) 20 may be N type.

In an element region in which the vertical NPN bipolar transistor is formed (left side of FIGS. 1A and 1B), the semiconductor device includes an N-type buried diffusion layer 11a and a P-type buried diffusion layer 11b that are arranged in the base substrate 10. Portions of the buried diffusion layers 11a and 11b may extend to the epitaxial layer 20.

Also, the semiconductor device includes a deep N-well 41 arranged in a predetermined region of the epitaxial layer 20 on the N-type buried diffusion layer 11a, a P-type impurity diffusion region 51 and a shallow N-well 61 arranged in the N-well 41, and a P-well 60 arranged outside the N-well 41 in the epitaxial layer 20. The P-type impurity diffusion region 51 constitutes a base region of the vertical NPN bipolar transistor. The N-well 61, along with the N-well 41 and the N-type buried diffusion layer 11a, constitutes a collector region of the vertical NPN bipolar transistor.

In the P-type impurity diffusion region 51, an N-type impurity diffusion region 71 and a P-type impurity diffusion region 81 having a higher impurity concentration than the P-type impurity diffusion region 51 are arranged. The N-type impurity diffusion region 71 constitutes an emitter region of the vertical NPN bipolar transistor. The P-type impurity diffusion region 81 constitutes a base contact region. An electrode 111 is arranged above the P-type impurity diffusion region 51 via an insulating film (gate insulating film). The insulating film and the electrode 111 are used as a hard mask when the impurity diffusion regions 71 and 81 are formed.

An N-type impurity diffusion region 91 is arranged in the N-well 61. The N-type impurity diffusion region 91 constitutes a collector contact region. A P-type impurity diffusion region 101 is arranged in the P-well 60. The P-type impurity diffusion region 101 constitutes a substrate contact region. Field oxide films 110 that are formed using a LOCOS (Local Oxidation of Silicon) method or the like are formed around the impurity diffusion regions 81 and 91. According to the above, the vertical NPN bipolar transistor is configured.

Meanwhile, in the element region in which the lateral PNP bipolar transistor is formed (right side in FIGS. 1A and 1B), the semiconductor device includes an N-type buried diffusion layer 12a and a P-type buried diffusion layer 12b that are arranged in the base substrate 10. Portions of the buried diffusion layers 12a and 12b may extend to the epitaxial layer 20.

Also, the semiconductor device includes an N-type impurity diffusion region (N-plug) 32 that is arranged in the epitaxial layer 20 and surrounds a predetermined region of the epitaxial layer 20 on the N-type buried diffusion layer 12a in plan view, a deep N-well 42 that is arranged in the predetermined region of the epitaxial layer 20, and the P-well 60 that is arranged outside the N-plug 32 in the epitaxial layer 20. Note that the expression "in plan view" as used herein refers to viewing portions in a direction vertical to a principal surface (upper surface in the diagram) of the epitaxial layer 20. The N-plug 32, along with the N-well 42 and the N-type buried diffusion layer 12a, constitutes a base region of the lateral PNP bipolar transistor.

An N-type impurity diffusion region 72 having a higher impurity concentration than the N-plug 32 is arranged in the N-plug 32. The N-type impurity diffusion region 72 constitutes a base contact region. P-type impurity diffusion regions 82 and 92 are arranged in the N-well 42. The P-type impurity diffusion region 82 constitutes an emitter region of the lateral PNP bipolar transistor, and the P-type impurity diffusion region 92 constitutes a collector region of the lateral PNP bipolar transistor.

A P-type impurity diffusion region 102 is arranged in the P-well 60. The P-type impurity diffusion region 102 constitutes a substrate contact region. The field oxide films 110 are arranged around the impurity diffusion regions 72, 82, and 92. Accordingly, the lateral PNP bipolar transistor is configured.

FIGS. 2A and 2B are diagrams illustrating a second example of the circuit element mounted in the semiconductor device according to one embodiment of the invention. The left side of FIGS. 2A and 2B shows a vertical zener diode, and the right side of FIGS. 2A and 2B shows a lateral zener diode. Also, FIG. 2A is a cross-sectional view and FIG. 2B is a plan view. Note that a field oxide film is omitted in FIG. 2B.

As shown in FIGS. 2A and 2B, the semiconductor device includes, in an element region in which the vertical zener diode is formed (left side in FIGS. 2A and 2B), an N-type buried diffusion layer 13a and a P-type buried diffusion layer 13b that are arranged in the base substrate 10. Portions of the buried diffusion layers 13a and 13b may extend to the epitaxial layer 20.

Also, the semiconductor device includes an N-type impurity diffusion region (N-plug) 33 that is arranged in the epitaxial layer 20 and surrounds a predetermined region of the epitaxial layer 20 on the N-type buried diffusion layer 13a in plan view, a deep N-well 43 arranged in the predetermined region of the epitaxial layer 20, and the P-well 60 that is arranged outside the N-plug 33, in the epitaxial layer 20.

An N-type impurity diffusion region 73 is arranged in the N-well 43, and a P-type impurity diffusion region 83 is arranged at least on the N-type impurity diffusion region 73. The N-type impurity diffusion region 73, along with the N-well 43, the N-plug 33, and the N-type buried diffusion layer 13a, constitutes a cathode region of the vertical zener diode.

The concentration and shape of the N-type impurity diffusion region 73 mainly determine the breakdown voltage of the vertical zener diode. Also, the N-type buried diffusion layer 13a and the N-plug 33 can improve the element isolation properties. The P-type impurity diffusion region 83 constitutes an anode region of the vertical zener diode.

An N-type impurity diffusion region 93 having a higher impurity concentration than the N-plug 33 is arranged in the N-plug 33. The N-type impurity diffusion region 93 constitutes a cathode contact region. A P-type impurity diffusion region 103 is arranged in the P-well 60. The P-type impurity diffusion region 103 constitutes a substrate contact region. The field oxide films 110 are arranged around the impurity diffusion regions 83 and 93. According to the above, the vertical zener diode is configured. The vertical zener diode shown in FIGS. 2A and 2B has a breakdown voltage of approximately 7V to 10V, for example.

Meanwhile, in the element region in which the lateral zener diode is formed (right side in FIGS. 2A and 2B), the semiconductor device includes an N-type buried diffusion layer 14a and a P-type buried diffusion layer 14b that are arranged in the base substrate 10. Portions of the buried diffusion layers 14a and 14b may extend to the epitaxial layer 20.

Also, the semiconductor device includes an N-type impurity diffusion region (N-plug) 34a that is arranged on the N-type buried diffusion layer 14a, in the epitaxial layer 20, and may further include an N-type impurity diffusion region (N-plug) 34b that is arranged in the epitaxial layer 20 and surrounds a predetermined region of the epitaxial layer 20 on the N-type buried diffusion layer 14a in plan view. The N-plugs 34a and 34b, along with the N-type buried diffusion layer 14a, constitutes a cathode region of the lateral zener diode.

An N-type impurity diffusion region 74 having a higher impurity concentration than the N-plug 34a is arranged in the N-plug 34a, and an N-type impurity diffusion region 84 having higher impurity concentration than the N-plug 34b is arranged in the N-plug 34b. The N-type impurity diffusion regions 74 and 84 constitutes a cathode contact region.

Furthermore, the semiconductor device includes a P-well 64 that is arranged, in the epitaxial layer 20, in a region in contact with the N-plug 34a, and the P-well 60 that is arranged, in the epitaxial layer 20, outside the N-plug 34b. The P-well 64 constitutes an anode region of the lateral zener diode.

A P-type impurity diffusion region 94 is arranged in the P-well 64. The P-type impurity diffusion region 94 constitutes an anode contact region. A P-type impurity diffusion region 104 is arranged in the P-well 60. The P-type impurity diffusion region 104 constitutes a substrate contact region. The field oxide films 110 are arranged around the impurity diffusion regions 74, 84, and 94. According to the above, the lateral zener diode is configured.

Here, at least the N-plug 34a and the N-type buried diffusion layer 14a have a high impurity concentration, are provided in a wide region, and are in contact with the epitaxial layer 20 having low impurity concentration, and as a result, the lateral zener diode shown in FIGS. 2A and 2B has a high breakdown voltage of approximately 16 V to 22 V, for example.

FIGS. 3A and 3B are diagrams illustrating a third example of the circuit element mounted in the semiconductor device according to one embodiment of the invention. The left side of FIGS. 3A and 3B shows a CMOS field effect transistor, and the right side of FIGS. 3A and 3B shows an LD (Lateral Double-diffused) MOS field effect transistor. Also, FIG. 3A is a cross-sectional view and FIG. 3B is a plan view. Note that a field oxide film is omitted in FIG. 3B.

As shown in FIGS. 3A and 3B, the semiconductor device includes, in the element region in which the CMOS field effect transistor is formed (left side in FIGS. 3A and 3B), an N-type buried diffusion layer 15a and a P-type buried diffusion layer 15b that are arranged in the base substrate 10. Portions of the buried diffusion layers 15a and 15b may extend to the epitaxial layer 20.

Also, the semiconductor device includes a deep N-well 45 that is arranged in a predetermined region of the epitaxial layer 20 on the N-type buried diffusion layer 15a, a shallow N-well 65a and a P-well 65b that are arranged in the N-well 45, and the P-well 60 that is arranged, in the epitaxial layer 20, outside the N-well 45. The N-well 65a constitutes a back gate region of a P-channel MOS field effect transistor, and the P-well 65b constitutes a back gate region of an N-channel MOS field effect transistor.

P-type impurity diffusion regions 75a and 85a and N-type impurity diffusion region 95a are arranged in the N-well 65a. The P-type impurity diffusion regions 75a and 85a constitute source and drain regions of the P-channel MOS field effect transistor, and the N-type impurity diffusion region 95a constitutes a back gate contact region. A gate electrode 115a is arranged above the N-well 65a via a gate insulating film.

N-type impurity diffusion regions 75b and 85b and a P-type impurity diffusion region 95b are arranged in the P-well 65b. The N-type impurity diffusion regions 75b and 85b constitute source and drain regions of the N-channel MOS field effect transistor, and the P-type impurity diffusion region 95b constitutes a back gate contact region. A gate electrode 115b is arranged above the P-well 65b via a gate insulating film.

A P-type impurity diffusion region 105 is arranged in the P-well 60. The P-type impurity diffusion region 105 constitutes a substrate contact region. The field oxide films 110 are arranged around the impurity diffusion region 75a and the like. According to the above, the CMOS field effect transistor is configured.

Meanwhile, in the element region in which the LDMOS field effect transistor is formed (right side in FIGS. 3A and 3B), the semiconductor device includes an N-type buried diffusion layer 16a and a P-type buried diffusion layer 16b that are arranged in the base substrate 10. Portions of the buried diffusion layers 16a and 16b may extend to the epitaxial layer 20.

Also, the semiconductor device includes a deep N-well 46 that is arranged in a predetermined region of the epitaxial layer 20 on the N-type buried diffusion layer 16a, a P-type impurity diffusion region 56a and an N-type impurity diffusion region 56b that are arranged in the N-well 46, and the P-well 60 that is arranged, in the epitaxial layer 20, outside the N-well 46.

The P-type impurity diffusion region 56a constitutes a body region of the LDMOS field effect transistor. The N-type impurity diffusion region 56b constitutes a drift region through which current flows between a drain region and the body region in the LDMOS field effect transistor, or a portion of the drain region. Note that the N-type impurity diffusion region 56b may be omitted.

An N-type impurity diffusion region 86 and a P-type impurity diffusion region 96 having a higher impurity concentration than the P-type impurity diffusion region 56a are arranged in the P-type impurity diffusion region 56a. The N-type impurity diffusion region 86 constitutes a source region of the LDMOS field effect transistor, and the P-type impurity diffusion region 96 constitutes a body contact region.

An N-type impurity diffusion region 76 having a higher impurity concentration than the N-type impurity diffusion region 56b is arranged in the N-type impurity diffusion region 56b. The N-type impurity diffusion region 76 constitutes the drain region of the LDMOS field effect transistor. A gate electrode 116 is arranged above the N-well 46 via an insulating film (gate insulating film or field oxide film 110).

A P-type impurity diffusion region 106 is arranged in the P-well 60. The P-type impurity diffusion region 106 constitutes a substrate contact region. The field oxide films 110 are arranged around the N-type impurity diffusion region 76. According to the above, the LDMOS field effect transistor is configured.

Figure 4A:
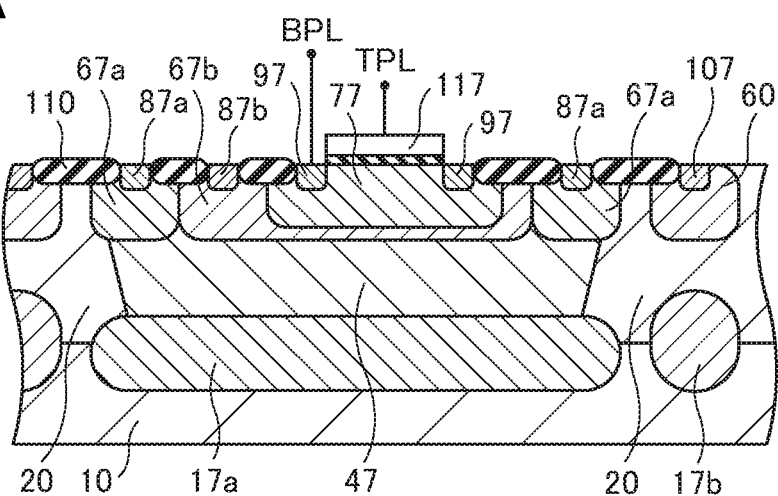
FIGS. 4A and 4B are diagrams illustrating a fourth example of the circuit element to be mounted in the semiconductor device.
Figure 4B:
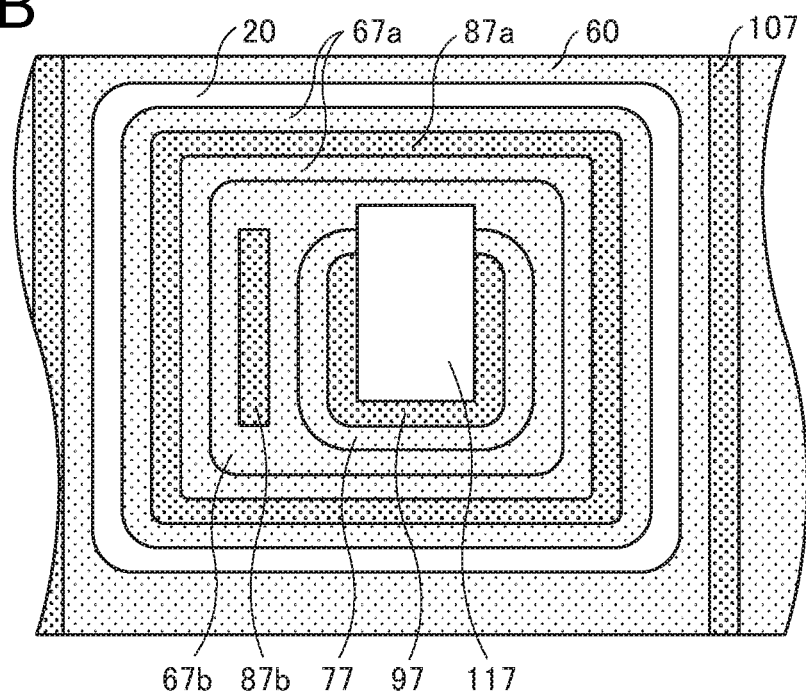

FIGS. 4A and 4B are diagrams illustrating a fourth example of the circuit element mounted in the semiconductor device according to one embodiment of the invention. FIGS. 4A and 4B show a capacitor that is formed using a MOS structure. Also, FIG. 4A is a cross-sectional view and FIG. 4B is a plan view. Note that a field oxide film is omitted in FIG. 4B.

As shown in FIGS. 4A and 4B, the semiconductor device includes, in the element region in which the capacitor is formed, an N-type buried diffusion layer 17a and a P-type buried diffusion layer 17b that are arranged in the base substrate 10. Portions of the buried diffusion layers 17a and 17b may extend to the epitaxial layer 20.

Also, the semiconductor device includes a deep N-well 47 that is arranged in a predetermined region of the epitaxial layer 20 on the N-type buried diffusion layer 17a, a shallow N-well 67a and a P-well 67b that are arranged in the N-well 47, and the P-well 60 that is arranged, in the epitaxial layer 20, outside the N-well 47.

An N-type impurity diffusion region 87a is arranged in the N-well 67a. The N-type impurity diffusion region 87a is used to apply a potential to the N-well 67a. An N-type impurity diffusion region 77 and a P-type impurity diffusion region 87b are arranged in the P-well 67b. The N-type impurity diffusion region 77 constitutes a first electrode BPL of the capacitor, and the P-type impurity diffusion region 87b is used to apply a potential to the P-well 67b.

An N-type impurity diffusion region 97 having a higher impurity concentration than the N-type impurity diffusion region 77 is arranged in the N-type impurity diffusion region 77. The N-type impurity diffusion region 97 constitutes a contact region of the first electrode. An insulating film (gate insulating film) is arranged on the N-type impurity diffusion region 77, and an electrode 117 is arranged on the insulating film. The electrode 117 constitutes a second electrode TPL of the capacitor.

A P-type impurity diffusion region 107 is arranged in the P-well 60. The P-type impurity diffusion region 107 constitutes a substrate contact region. The field oxide films 110 are arranged around the impurity diffusion regions 87a and 87b. According to the above, the capacitor is configured.

Here, the P-well 67b is arranged so as to surround the N-type impurity diffusion region 77, in the epitaxial layer 20. Also, the N-wells 47 and 67a are arranged so as to surround the P-well 67b, in the epitaxial layer 20. As a result of providing the P-well 67b that surrounds the N-type impurity diffusion region 77 and the N-wells 47 and 67a that surround the P-well 67b in the epitaxial layer 20, in this way, insulation property of the first electrode of the capacitor can be improved.

Figure 9:
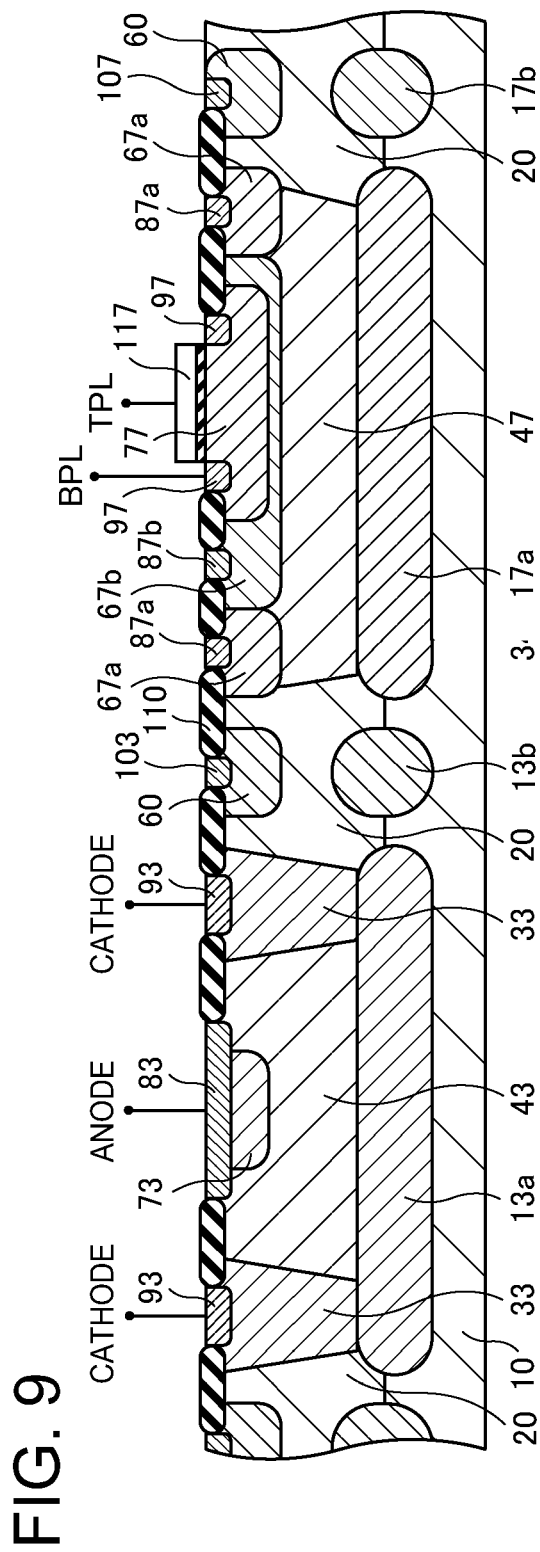
FIG. 9 is a diagram illustrating an example of the circuit element to be mounted in the semiconductor device

According to the present embodiment, a vertical zener diode that includes the N-type impurity diffusion region 73 that mainly determines the breakdown voltage and a capacitor that includes the N-type impurity diffusion region 77 that reduces the voltage dependence of capacitance are mounted together in the same semiconductor device, and thereby various circuits can be realized. An example of this is shown in FIG. 9.

Manufacturing Method

Next, a manufacturing method of the semiconductor device according to one embodiment of the invention will be described. With the manufacturing method of the semiconductor device according to one embodiment of the invention, the semiconductor device in which a plurality of different types of circuit elements are mounted can be manufactured. Hereinafter, manufacturing processes of these circuit elements will be described with reference to FIGS. 5A to 8J. Note that the manufacturing processes of the plurality of different types of circuit elements shown in FIGS. 5A to 8J are performed on the same base substrate 10.

Figure 5A:
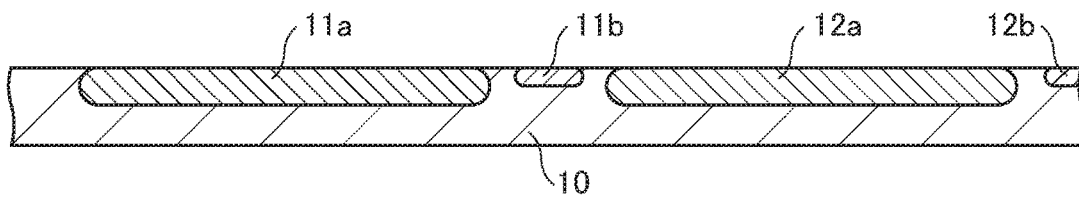
FIGS. 5A to 5J are cross-sectional views of a manufacturing process of the first example of the circuit element to be mounted in the semiconductor device.
Figure 5B:
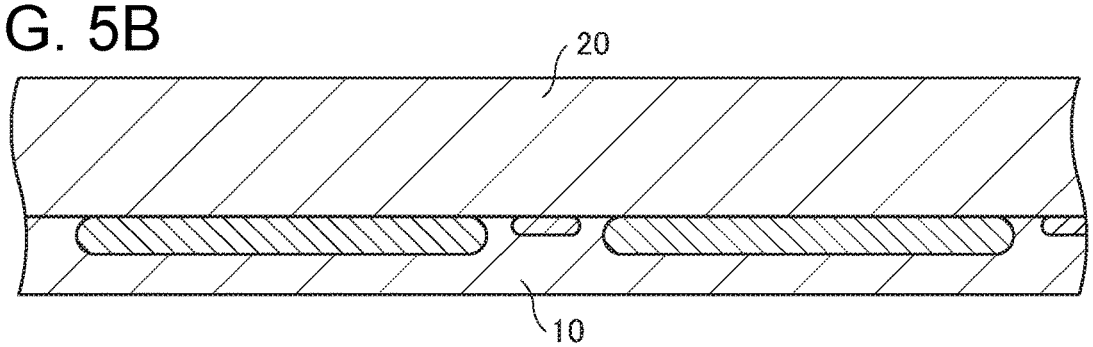
Figure 5C:
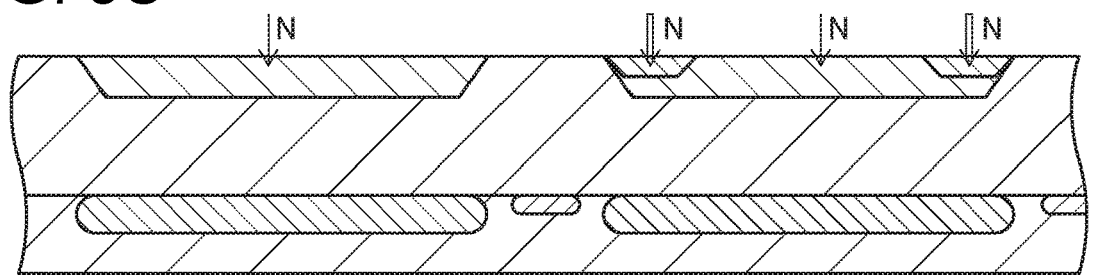

FIGS. 5A to 8J are cross-sectional views, of the manufacturing processes, of the first to fourth examples of the circuit elements mounted in the semiconductor device according to one embodiment of the invention. The left side of FIGS. 5A and 5J shows manufacturing processes of the vertical NPN bipolar transistor, and the right side of FIGS. 5A and 5J shows manufacturing processes of the lateral PNP bipolar transistor.

Figure 6A:
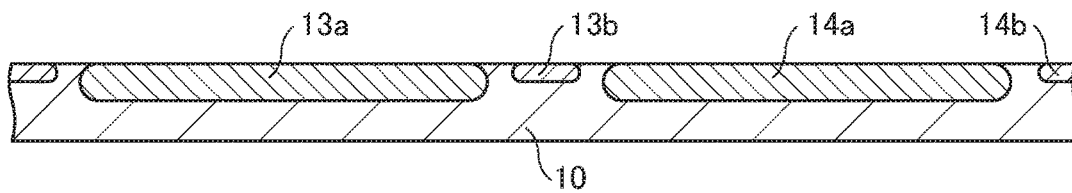
FIGS. 6A to 6J are cross-sectional views of a manufacturing process of the second example of the circuit element to be mounted in the semiconductor device.
Figure 6B:
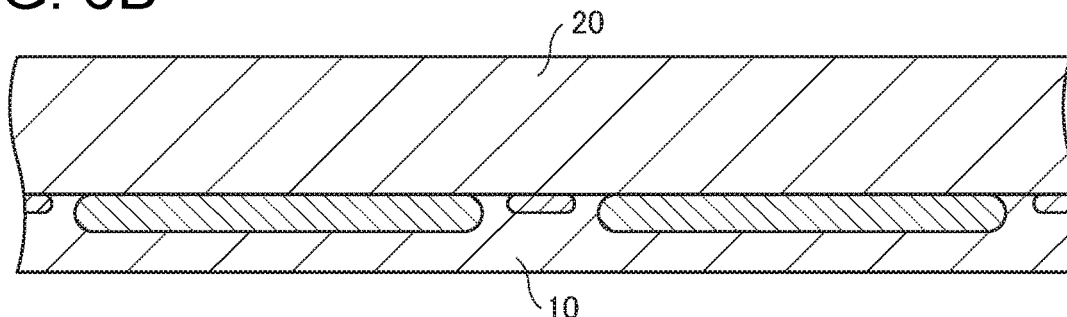
Figure 6C:
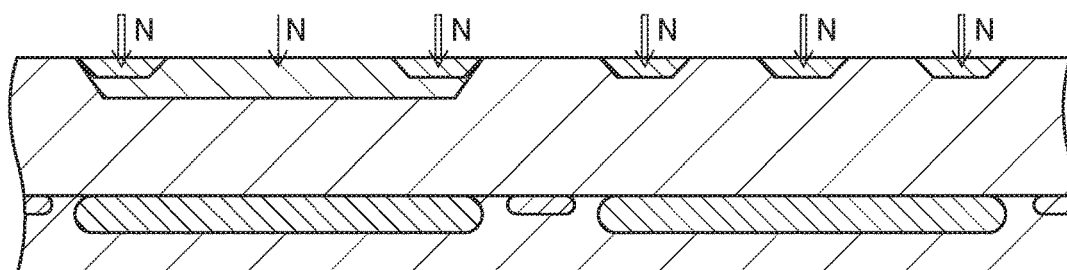
Figure 6D:
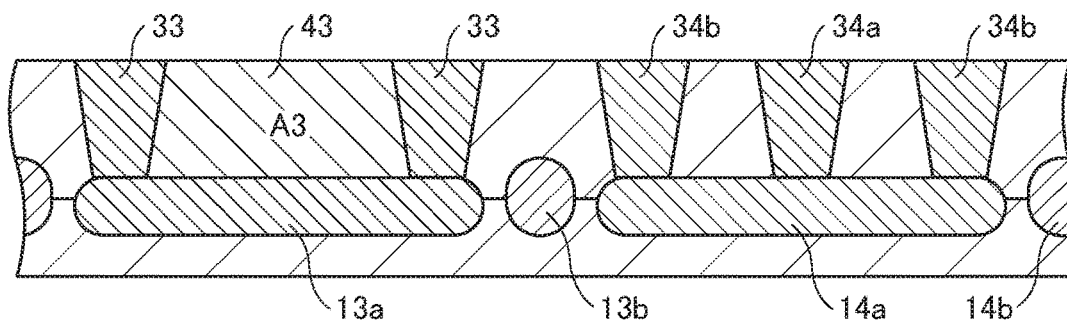
Figure 6E:
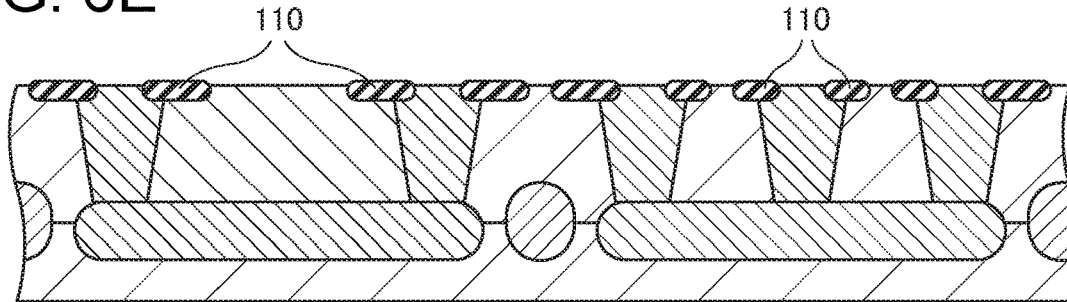
Figure 6F:
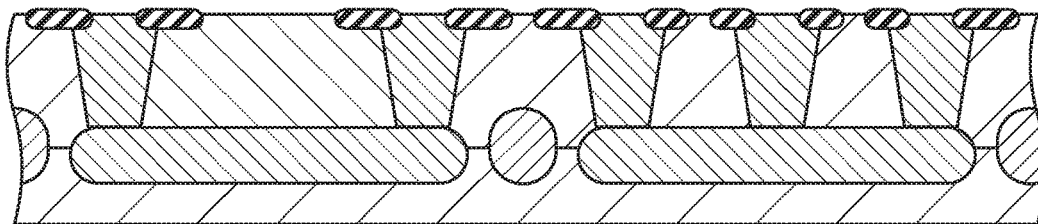
Figure 6G:
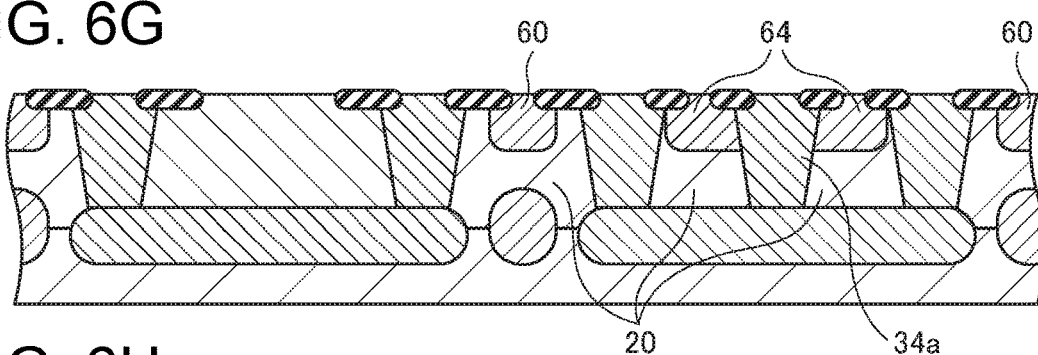
Figure 6H:
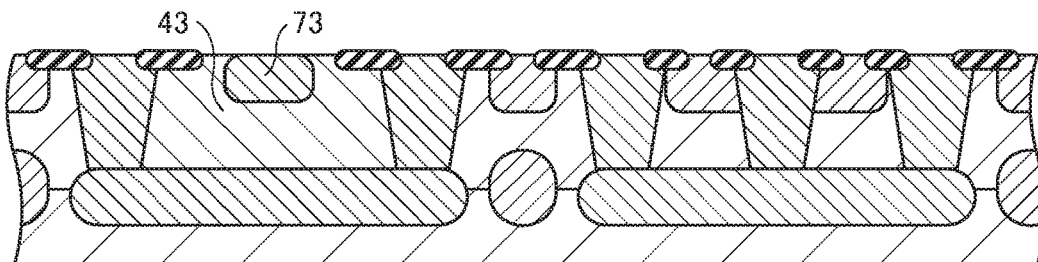
Figure 6I:
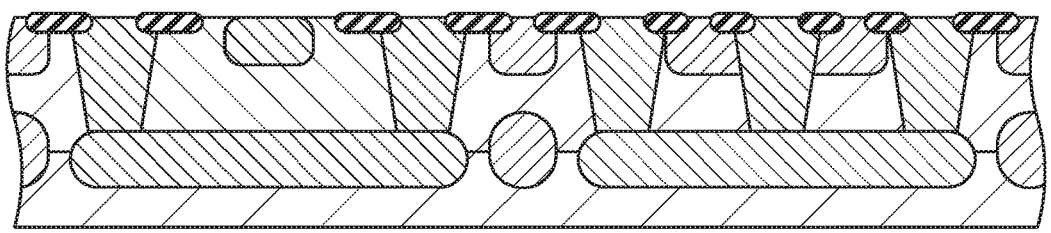
Figure 6J:
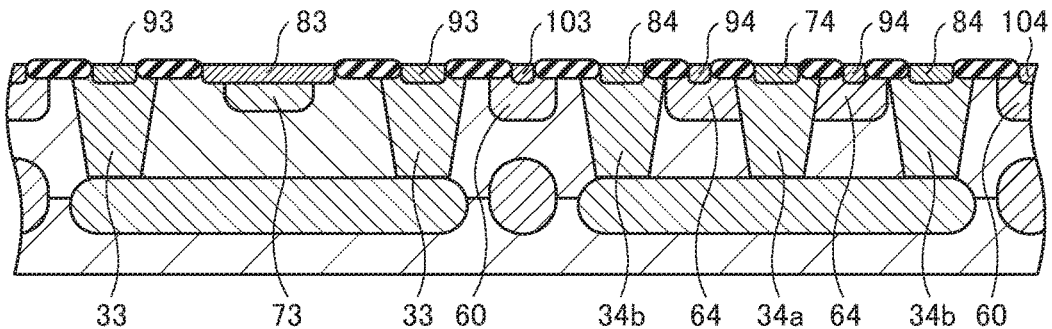
Figure 7A:
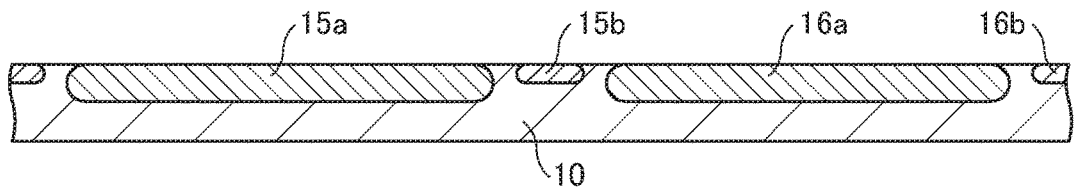
FIGS. 7A to 7J are cross-sectional views of a manufacturing process of the third example of the circuit element to be mounted in the semiconductor device.
Figure 7B:
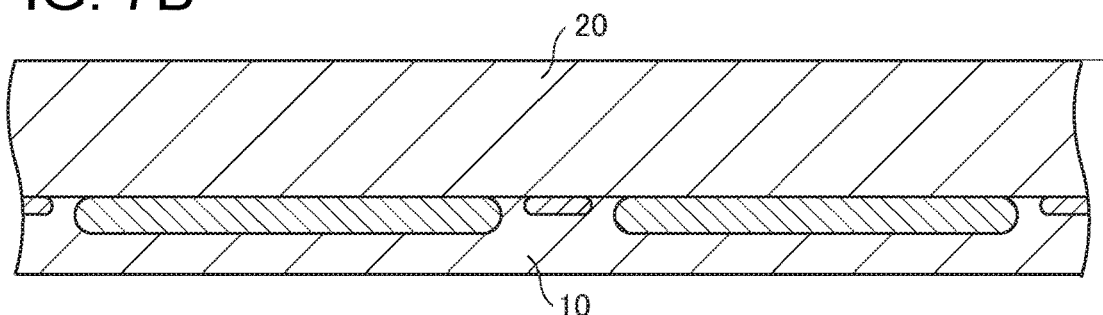
Figure 7C:
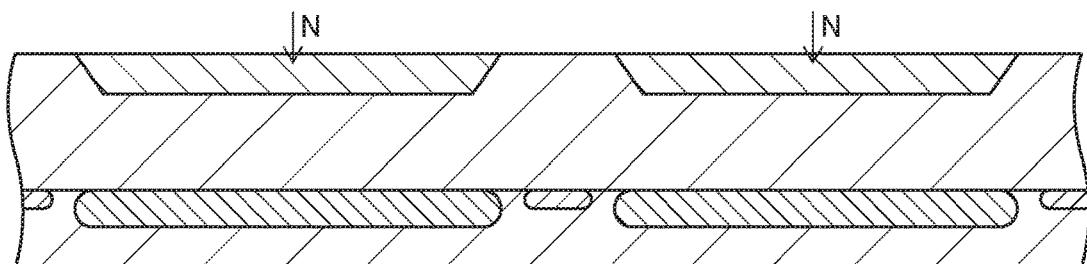
Figure 7D:
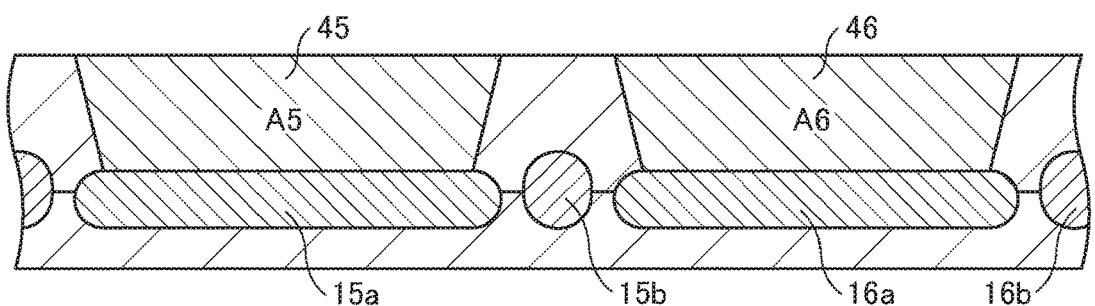
Figure 7E:
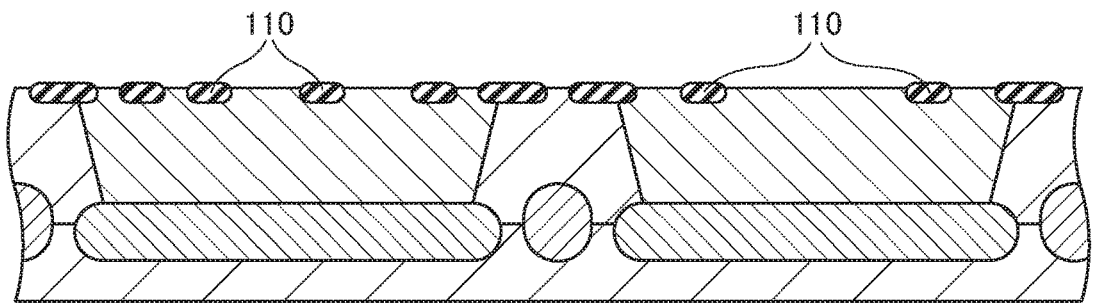
Figure 7J:
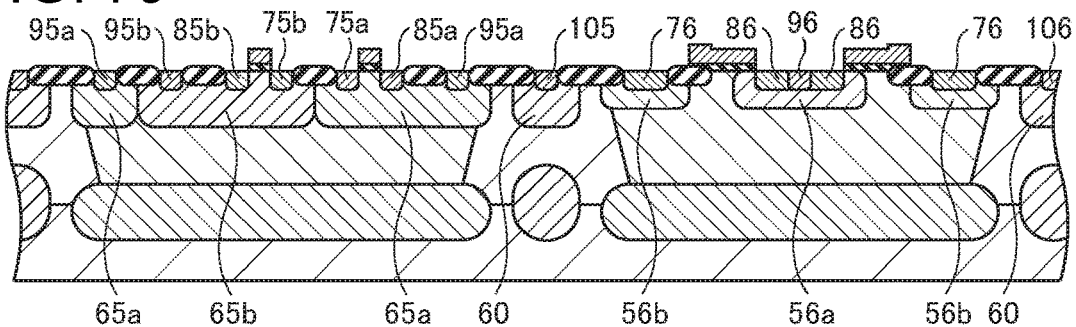
Figure 8A:
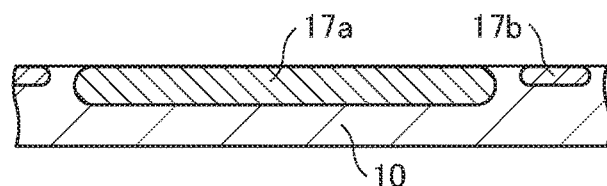
FIGS. 8A to 8J are cross-sectional views of a manufacturing process of the fourth example of the circuit element to be mounted in the semiconductor device.
Figure 8B:
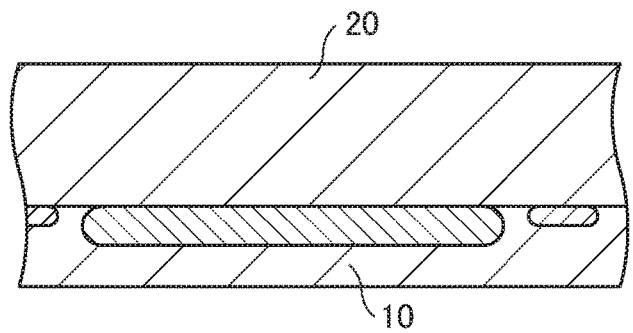
Figure 8C:
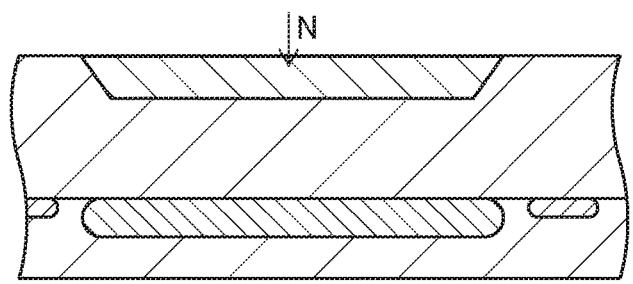
Figure 8D:
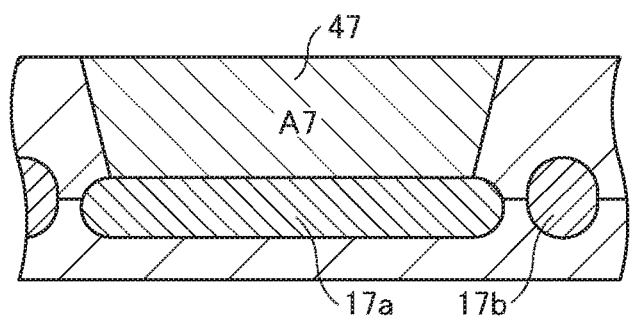
Figure 8E:
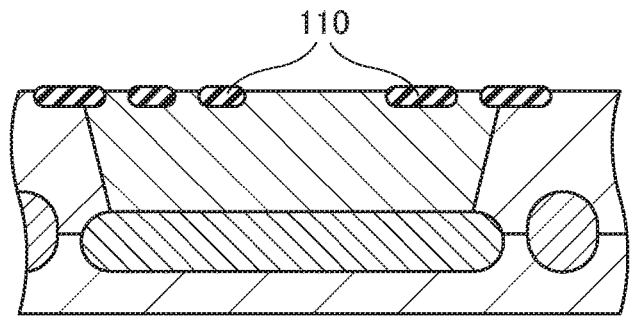
Figure 8F:
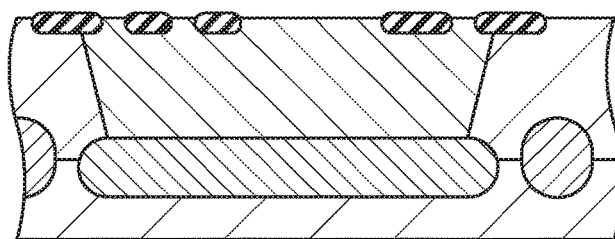
Figure 8G:
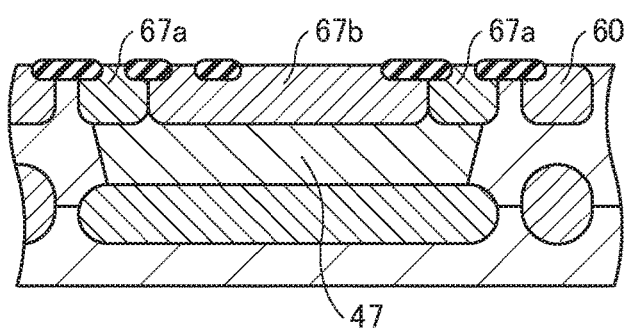

Also, the left side of FIGS. 6A and 6J shows manufacturing processes of the vertical zener diode, and the right side of FIGS. 6A and 6J shows manufacturing processes of the lateral zener diode. The left side of FIGS. 7A and 7J shows manufacturing processes of the CMOS field effect transistor, and the right side of FIGS. 7A and 7J shows manufacturing processes of the LDMOS field effect transistor. FIGS. 8A and 8J show manufacturing processes of the capacitor that is formed using a MOS structure.

First, a silicon (Si) substrate including boron (B) or the like, as a P-type impurity, is prepared as the P-type base substrate (semiconductor substrate) 10, for example. N-type impurities such as antimony (Sb) or phosphorus (P) ions are simultaneously implanted into a first group of regions of the base substrate 10 using a mask formed using a photolithography method, and P-type impurities such as boron (B) ions are simultaneously implanted into a second group of regions. Thereafter, as a result of the impurities being thermally diffused, the N-type buried diffusion layers 11a to 17a are simultaneously formed, and the P-type buried diffusion layers 11b to 17b are simultaneously formed, as shown in FIGS. 5A, 6A, 7A, and 8A.

Next, as shown in FIGS. 5B, 6B, 7B, and 8B, the P-type epitaxial layer (semiconductor layer) 20 is formed on the base substrate 10 by epitaxial growth. For example, as a result of mixing a gas containing P-type impurities such as boron (B) when the silicon layer is epitaxially grown on the silicon substrate, the P-type epitaxial layer 20 having a desired conductivity (specific resistance) can be formed. The thickness of the epitaxial layer 20 is approximately 4.5 μm to 5 μm, for example. The epitaxial layer (semiconductor layer) 20 may be N type.

Next, in the process shown in FIGS. 5C, 6C, 7C, and 8C, N-type impurities such as phosphorus (P) ions are simultaneously implanted into a plurality of regions of the epitaxial layer 20 using a mask formed using a photolithography method. For example, when the N-plugs are formed by implanting phosphorus ions into the silicon epitaxial layer, the dose is approximately $2 \times 10^{14}$ atom/cm$^2$ to $5 \times 10^{14}$ atom/cm$^2$.

Furthermore, in the process shown in FIGS. 5D, 6D, 7D, and 8D, as a result of the N-type impurities implanted into the epitaxial layer 20 being thermally diffused, the N-type impurities reach the N-type buried diffusion layers 11a to 17a, and the N-plugs 32 to 34b are simultaneously formed and the N-wells 41 to 43 and 45 to 47 are simultaneously formed.

For example, when phosphorus ions implanted into the silicon epitaxial layer are diffused, the heating temperature is approximately 1100° C. to 1150° C. Here, portions of the buried diffusion layers 11a to 17a and 11b to 17b may extend to the epitaxial layer 20 due to thermal diffusion of the impurities.

Figure 5D:
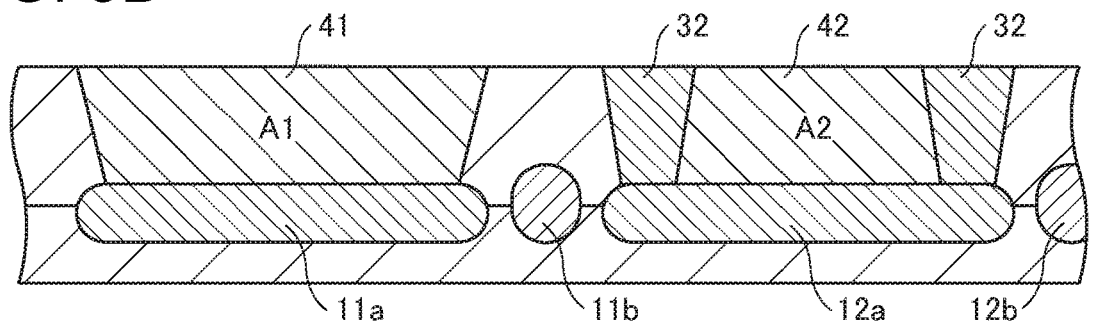
Figure 5E:
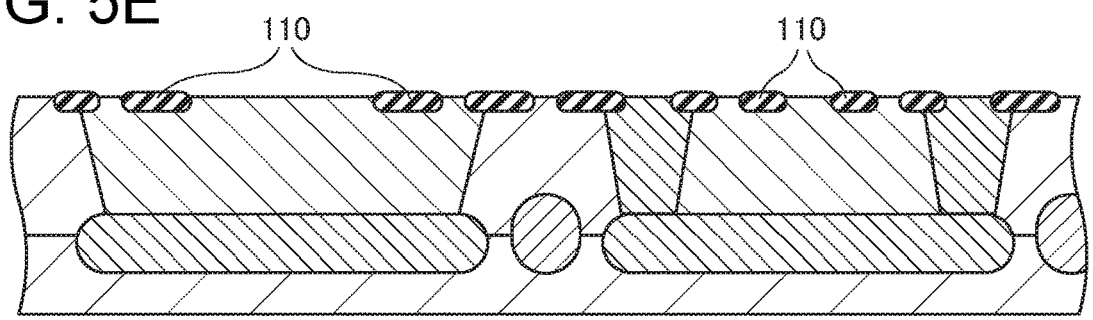

Accordingly, as shown in FIG. 5D, the N-plug 32 that surrounds a region A2 of the epitaxial layer 20 on the N-type buried diffusion layer 12a in plan view is formed in the epitaxial layer 20. Simultaneously, as shown in FIG. 6D, the N-plug 33 that surrounds a region A3 of the epitaxial layer 20 on the N-type buried diffusion layer 13a in plan view is formed in the epitaxial layer 20.

Also, along with the N-plug 34a being formed in the epitaxial layer 20 on the N-type buried diffusion layer 14a, the N-plug 34b that surrounds a region A4 of the epitaxial layer 20 on the N-type buried diffusion layer 14a in plan view is formed in the epitaxial layer 20. Furthermore, the N-wells 41 to 43 and 45 to 47 are formed simultaneously in the regions A1 to A3 and regions A5 to A7 of the epitaxial layer 20.

Next, in the process shown in FIGS. 5E, 6E, 7E, and 8E, the field oxide films 110 are formed in predetermined regions of a principal surface (upper surface in the diagram) of the epitaxial layer 20 using a LOCOS method, for example. Note that the field oxide films 110 may be formed after the impurity diffusion region 56a and the like have been formed.

Figure 5F:
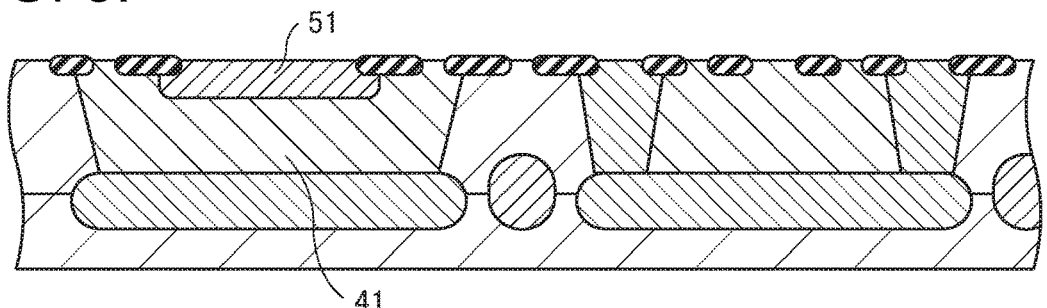
Figure 7F:
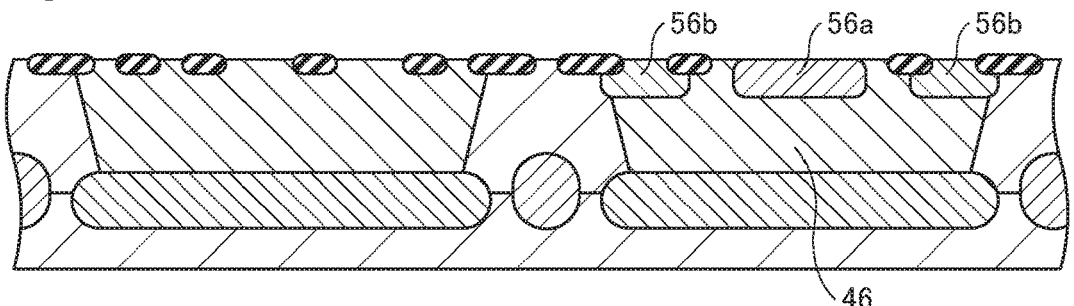

Next, in the process shown in FIGS. 5F and 7F, P-type impurities such as boron (B) ions are implanted into partial regions of N-wells 41 and 46 using a mask formed using a photolithography method. Accordingly, the P-type impurity diffusion region (base region) 51 is formed in the N-well 41 as shown in FIG. 5F, and simultaneously, the P-type impurity diffusion region (body region) 56a is formed in the N-well 46 as shown in FIG. 7F.

Also, in the process shown in FIG. 7F, N-type impurities such as phosphorus (P) ions are implanted into another partial region of the N-well 46 using a mask formed using a photolithography method. Accordingly, as shown in FIG. 7F, the N-type impurity diffusion region (drift region or drain region) 56b is formed in the N-well 46.

Figure 5G:
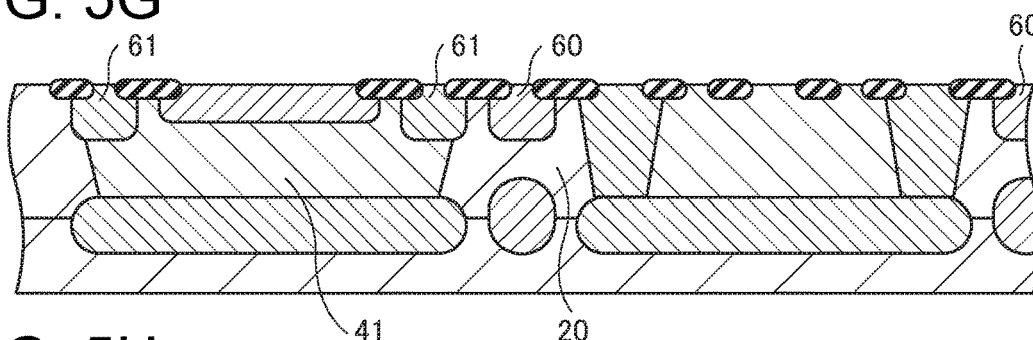
Figure 5H:
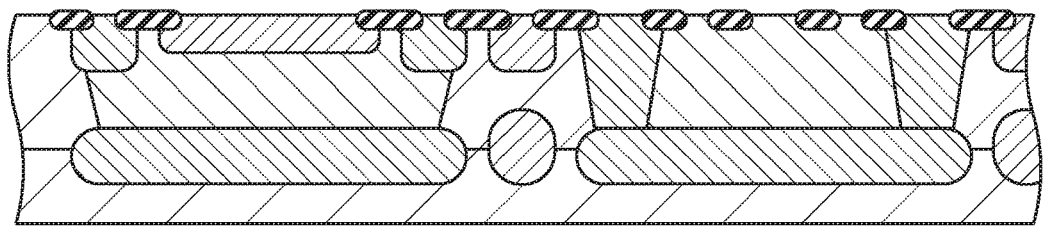
Figure 7G:
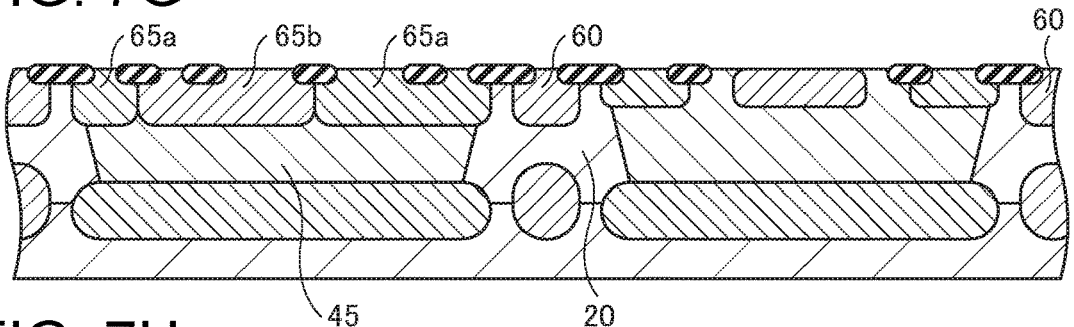
Figure 7H:
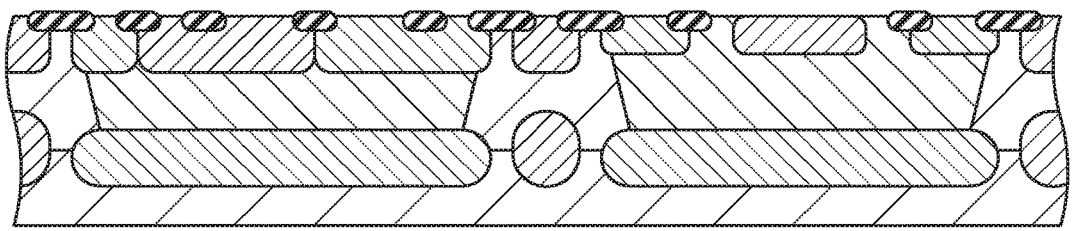

Next, N-type impurities such as phosphorus (P) ions are implanted into partial regions of the deep N-wells using a mask formed using a photolithography method. Accordingly, as shown in FIG. 5G, the shallow N-well 61 is formed in the deep N-well 41. Simultaneously, the shallow N-well 65a is formed in the deep N-well 45 as shown in FIG. 7G, and the shallow N-well 67a is formed in the deep N-well 47 as shown in FIG. 8G.

Also, P-type impurities such as boron (B) ions are implanted into other partial regions of the epitaxial layer 20 or the deep N-wells using a mask formed using a photolithography method. Accordingly, as shown in FIGS. 5G, 6G, 7G, and 8G, the shallow P-wells 60 are formed in the epitaxial layer 20.

Simultaneously, as shown in FIG. 6G, the shallow P-well 64 is formed in the epitaxial layer 20 in a region that is in contact with the N-plug 34a. Also, the shallow P-well 65b is formed in the deep N-well 45 as shown in FIG. 7G, and the shallow P-well 67b is formed in the deep N-well 47 as shown in FIG. 8G.

Figure 8H:
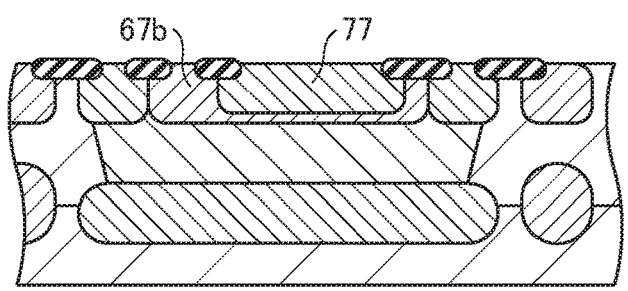

Next, in the process shown in FIGS. 6H and 8H, N-type impurities such as phosphorus (P) ions are simultaneously implanted into partial regions of the N-well 43 and the P-well 67b using a mask formed using a photolithography method. Accordingly, the N-type impurity diffusion region 73 is formed in the deep N-well 43 as shown in FIG. 6H, and the N-type impurity diffusion region 77 is formed in the P-well 67b as shown in FIG. 8H.

In the case where the N-type impurity diffusion region is formed by implanting phosphorus ions into the silicon epitaxial layer, the conditions of implantation are as follows. The acceleration voltage is approximately 100 keV to 150 keV, and the dose is approximately $2 \times 10^{13}$ atom/cm$^2$ to $6 \times 10^{13}$ atom/cm$^2$. In this way, a cathode of the zener diode having a breakdown voltage of approximately 7 V to 10 V, and an impurity diffusion region of the capacitor in which abnormal growth of oxide film can be suppressed can be simultaneously formed.

Next, the gate insulating film (not shown) is formed on the principal surface of the epitaxial layer 20 by thermally oxidizing the principal surface of the epitaxial layer 20, for example. Accordingly, the gate insulating film is formed on the P-type impurity diffusion region 51 shown in FIG. 5I. Simultaneously, the gate insulating films are formed on the N-well 65a, the P-well 65b, and the N-well 46 shown in FIG. 7I. Also, the gate insulating film is formed on the N-type impurity diffusion region 77 shown in FIG. 8I.

Figure 5I:
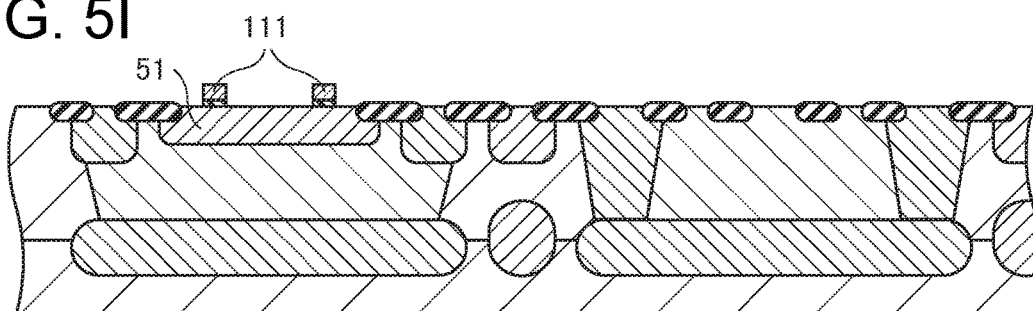
Figure 7I:
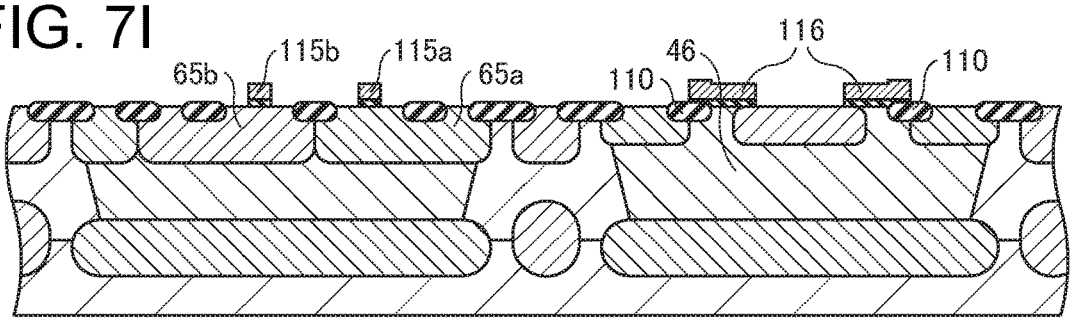

Furthermore, electrodes or gate electrodes are formed on the gate insulating films. Accordingly, as shown in FIG. 5I, the electrode 111 is formed above the P-type impurity diffusion region 51 via the gate insulating film. Simultaneously, as shown in FIG. 7I, the gate electrode 115a is formed above the N-well 65a via the gate insulating film, the gate electrode 115b is formed above the P-well 65b via the gate insulating film, and the gate electrode 116 is formed above the N-well 46 via the gate insulating film or the field oxide film 110.

Figure 8I:
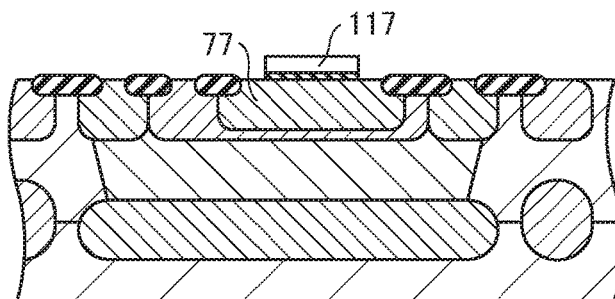
Figure 8J:
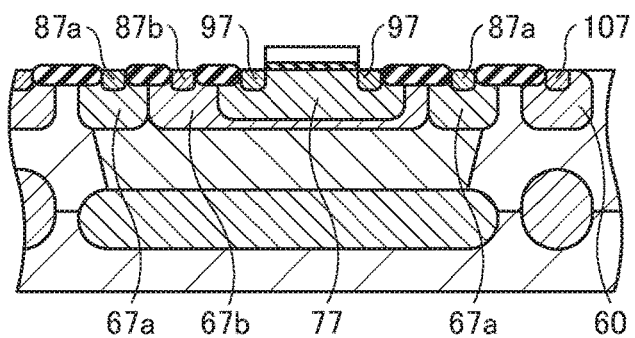

Also, as shown in FIG. 8I, the electrode 117 is formed above the N-type impurity diffusion region 77 via the gate insulating film. The electrodes 111 and 117 and the gate electrodes 115a, 115b, and 116 are made of polysilicon that is doped with impurities and has conductivity, or the like, for example.

Figure 5J:
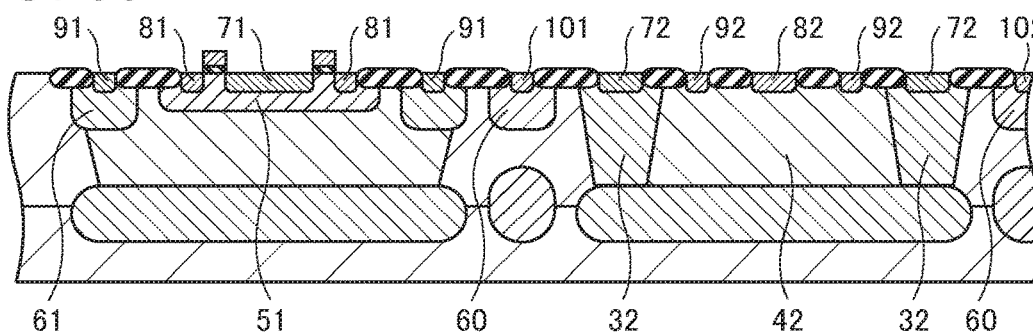

Next, in the process shown in FIGS. 5J, 6J, 7J, and 8J, N-type impurities such as phosphorus (P) ions are implanted into various wells and impurity diffusion regions. Accordingly, as shown in FIG. 5J, the N-type impurity diffusion region 71 is formed in the P-type impurity diffusion region 51, and the N-type impurity diffusion region 91 is formed in the N-well 61. Simultaneously, the N-type impurity diffusion region 72 is formed in the N-plug 32.

Also, as shown in FIG. 6J, the N-type impurity diffusion region 93 is formed in the N-plug 33, the N-type impurity diffusion regions 74 and 84 are respectively formed in the N-plugs 34a and 34b. Also, as shown in FIG. 7J, the N-type impurity diffusion region 95a is formed in the N-well 65a, the N-type impurity diffusion regions 75b and 85b are formed in the P-well 65b, the N-type impurity diffusion region 86 is formed in the P-type impurity diffusion region 56a, and the N-type impurity diffusion region 76 is formed in the N-type impurity diffusion region 56b. Also, as shown in FIG. 8J, the N-type impurity diffusion region 87a is formed in the N-well 67a, and the N-type impurity diffusion region 97 is formed in the N-type impurity diffusion region 77.

Furthermore, P-type impurities such as boron (B) ions are implanted into various wells and impurity diffusion regions. Accordingly, as shown in FIGS. 5J, 6J, 7J, and 8J, the P-type impurity diffusion regions 101 to 107 are each formed in the P-well 60. Simultaneously, as shown in FIG. 5J, the P-type impurity diffusion region 81 is formed in the P-type impurity diffusion region 51, and the P-type impurity diffusion regions 82 and 92 are formed in the N-well 42.

Also, as shown in FIG. 6J, the P-type impurity diffusion region 83 is formed at least on the N-type impurity diffusion region 73, and the P-type impurity diffusion region 94 is formed in the P-well 64. Also, as shown in FIG. 7J, the P-type impurity diffusion regions 75a and 85a are formed in the N-well 65a, the P-type impurity diffusion region 95b is formed in the P-well 65b, and the P-type impurity diffusion region 96 is formed in the P-type impurity diffusion region 56a. Also, as shown in FIG. 8J, the P-type impurity diffusion region 87b is formed in the P-well 67b.

In the process of implanting impurities, the field oxide films 110, the electrodes 111 and 117, the gate electrodes 115a, 115b, and 116 are used as a hard mask. Processes thereafter are similar to those in the manufacturing processes of a standard semiconductor device. That is, a predetermined number of interlayer insulating films and interconnect layers are formed. A contact hole is formed in an interlayer insulating film above each of the contact regions and the gate electrodes, and an interconnect made of aluminum (Al) or the like, or a plug made of tungsten (W) or the like is connected to each of the contact regions and the gate electrodes.

According to the manufacturing method of a semiconductor device according to the present embodiment, the N-type impurity diffusion region 73 that mainly determines the breakdown voltage of the vertical zener diode and the N-type impurity diffusion region 77 that reduces the voltage dependence of capacitance of the capacitor can be formed in the same processes and with the same conditions. Accordingly, a semiconductor device in which a zener diode having a desired breakdown voltage and a capacitor in which voltage dependence of capacitance is reduced are mounted together without significantly increasing the manufacturing processes.

The embodiment given above has been described taking a case where a P-type semiconductor substrate is used, but an N-type semiconductor substrate may be used. In this case, it is sufficient that P type and N type are reversed in other constituent components. The invention is not limited to the embodiment described above, and various modifications can be made by a person having ordinary skill in the art within the technical scope of the invention.

The entire disclosure of Japanese Patent Application No. 2015-242058, filed Dec. 11, 2015 is expressly incorporated by reference herein.

What is claimed is:

1. A semiconductor device comprising:
   a semiconductor layer;
   a first conductivity type first well that is arranged in a first region of the semiconductor layer;
   a first conductivity type first impurity diffusion region that is arranged in the first well;
   a first conductivity type second impurity diffusion region that is arranged in a second region of the semiconductor layer;
   a second conductivity type second well that is arranged so as to surround the second impurity diffusion region in the semiconductor layer;
   an insulating film that is arranged on the second impurity diffusion region;
   an electrode that is arranged on the insulating film; and
   a second conductivity type third impurity diffusion region that is arranged at least on the first impurity diffusion region.

2. The semiconductor device according to claim 1, further comprising:
   a second conductivity type semiconductor substrate in which the semiconductor layer is arranged;
   a first conductivity type first buried diffusion layer that is arranged in the semiconductor substrate; and
   a first conductivity type fourth impurity diffusion region that is arranged in the semiconductor layer and surrounds the first region of the semiconductor layer on the first buried diffusion layer in plan view.

3. The semiconductor device according to claim 2, further comprising:
   a first conductivity type second buried diffusion layer that is arranged in the semiconductor substrate; and
   a first conductivity type fourth well that is arranged in the second region of the semiconductor layer,
   wherein the second impurity diffusion region is arranged on the fourth well.

4. The semiconductor device according to claim 1, further comprising:
   a second conductivity type semiconductor substrate in which the semiconductor layer is arranged;
   a first conductivity type second buried diffusion layer that is arranged in the semiconductor substrate; and
   a first conductivity type fourth well that is arranged in the second region of the semiconductor layer,
   wherein the second impurity diffusion region is arranged on the fourth well.

5. A semiconductor device comprising:
   a semiconductor layer;
   a first conductivity type first well that is arranged in a first region of the semiconductor layer;
   a first conductivity type first impurity diffusion region that is arranged in the first well;
   a first conductivity type second impurity diffusion region that is arranged in a second region of the semiconductor layer;
   a first conductivity type third well that is arranged so as to surround the second impurity diffusion region in the semiconductor layer;
   an insulating film that is arranged on the second impurity diffusion region;
   an electrode that is arranged on the insulating film; and
   a second conductivity type third impurity diffusion region that is arranged at least on the first impurity diffusion region.

6. The semiconductor device according to claim 5, further comprising:
   a second conductivity type semiconductor substrate in which the semiconductor layer is arranged;
   a first conductivity type first buried diffusion layer that is arranged in the semiconductor substrate; and
   a first conductivity type fourth impurity diffusion region that is arranged in the semiconductor layer and surrounds the first region of the semiconductor layer on the first buried diffusion layer in plan view.

7. The semiconductor device according to claim 6, further comprising:
   a first conductivity type second buried diffusion layer that is arranged in the semiconductor substrate; and
   a first conductivity type fourth well that is arranged in the second region of the semiconductor layer,
   wherein the second impurity diffusion region is arranged on the fourth well.

8. The semiconductor device according to claim 5, further comprising:
   a second conductivity type semiconductor substrate in which the semiconductor layer is arranged;
   a first conductivity type second buried diffusion layer that is arranged in the semiconductor substrate; and
   a first conductivity type fourth well that is arranged in the second region of the semiconductor layer,
   wherein the second impurity diffusion region is arranged on the fourth well.

9. A semiconductor device comprising:
   a semiconductor layer;
   a first conductivity type first well that is arranged in a first region of the semiconductor layer;
   a first conductivity type first impurity diffusion region that is arranged in the first well;
   a first conductivity type second impurity diffusion region that is arranged in a second region of the semiconductor layer;
   a second conductivity type second well that surrounds the second impurity diffusion region and a first conductivity type third well that surrounds the second well in the semiconductor layer;
   an insulating film that is arranged on the second impurity diffusion region;
   an electrode that is arranged on the insulating film; and
   a second conductivity type third impurity diffusion region that is arranged at least on the first impurity diffusion region.

10. The semiconductor device according to claim 9, further comprising:
    a second conductivity type semiconductor substrate in which the semiconductor layer is arranged;
    a first conductivity type first buried diffusion layer that is arranged in the semiconductor substrate; and
    a first conductivity type fourth impurity diffusion region that is arranged in the semiconductor layer and surrounds the first region of the semiconductor layer on the first buried diffusion layer in plan view.

11. The semiconductor device according to claim 10, further comprising:
    a first conductivity type second buried diffusion layer that is arranged in the semiconductor substrate; and
    a first conductivity type fourth well that is arranged in the second region of the semiconductor layer,
    wherein the second impurity diffusion region is arranged on the fourth well.

12. The semiconductor device according to claim 9, further comprising:
    a second conductivity type semiconductor substrate in which the semiconductor layer is arranged;

a first conductivity type second buried diffusion layer that is arranged in the semiconductor substrate; and
a first conductivity type fourth well that is arranged in the second region of the semiconductor layer,
wherein the second impurity diffusion region is arranged on the fourth well.

* * * * *